(12) United States Patent
Liu

(10) Patent No.: US 8,124,955 B2
(45) Date of Patent: *Feb. 28, 2012

(54) MEMORY DEVICES AND METHODS OF FORMING THE SAME

(75) Inventor: Jun Liu, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 12/840,839

(22) Filed: Jul. 21, 2010

(65) Prior Publication Data

US 2010/0283030 A1    Nov. 11, 2010

Related U.S. Application Data

(63) Continuation of application No. 12/195,510, filed on Aug. 21, 2008, now Pat. No. 7,772,583.

(51) Int. Cl.
*H01L 45/00* (2006.01)

(52) U.S. Cl. ............. 257/4; 257/3; 257/42; 257/296; 257/314; 257/102; 257/103; 257/257

(58) Field of Classification Search ............. 257/4, 3, 257/42, 296, 314, 102, 103, 257

See application file for complete search history.

(56) References Cited

U.S. PATENT DOCUMENTS 5,296,716 A    3/1994   Ovshinsky et al.
(Continued)

FOREIGN PATENT DOCUMENTS

JP    2006 032729 A    2/2006
(Continued)

OTHER PUBLICATIONS

International Search Report for International Application No. PCT/US2009/054182, mailed Mar. 23, 2010, three (3) pages.

(Continued)

*Primary Examiner* — Long Pham
(74) *Attorney, Agent, or Firm* — TraskBritt

(57) ABSTRACT

Memory devices having a plurality of memory cells, with each memory cell including a phase change material having a laterally constricted portion thereof. The laterally constricted portions of adjacent memory cells are vertically offset and positioned on opposite sides of the memory device. Also disclosed are memory devices having a plurality of memory cells, with each memory cell including first and second electrodes having different widths. Adjacent memory cells have the first and second electrodes offset on vertically opposing sides of the memory device. Methods of forming the memory devices are also disclosed.

13 Claims, 8 Drawing Sheets

U.S. PATENT DOCUMENTS

| | | |
|---|---|---|
| 7,102,151 B2 | 9/2006 | Reinberg et al. |
| 7,323,357 B2 | 1/2008 | Seidl |
| 7,374,174 B2 | 5/2008 | Liu et al. |
| 7,772,583 B2 * | 8/2010 | Liu .................................. 257/4 |
| 2006/0018156 A1 | 1/2006 | Happ |
| 2006/0145199 A1 | 7/2006 | Lee |
| 2007/0034848 A1 | 2/2007 | Liu |
| 2007/0051935 A1 | 3/2007 | Lee et al. |
| 2007/0181932 A1 | 8/2007 | Happ et al. |
| 2008/0048213 A1 | 2/2008 | Liu |
| 2009/0134431 A1 | 5/2009 | Tabata et al. |

FOREIGN PATENT DOCUMENTS

| | | |
|---|---|---|
| JP | 2007243169 A | 9/2007 |
| KR | 100640002 B2 | 11/2006 |
| KR | 100757415 B1 | 9/2007 |
| KR | 1020080069036 A | 7/2008 |

OTHER PUBLICATIONS

International Written Opinion for International Application No. PCT/US2009/054182, mailed Mar. 23, 2010, three (3) pages.
Supplementary European Search Report and Search Opinion, Application No. EP 09808723.2, mailed Nov. 3, 2011, six (6) pages.

* cited by examiner

MEMORY DEVICES AND METHODS OF FORMING THE SAME

CROSS-REFERENCE TO RELATED APPLICATION

This application is a continuation of U.S. patent application Ser. No. 12/195,510, filed Aug. 21, 2008, now U.S. Pat. No. 7,772,583, issued Aug. 10, 2010 the disclosure of which is incorporated by reference herein in its entirety.

TECHNICAL FIELD

Embodiments of the present invention relate to memory devices and methods of fabricating the same. In particular, the present invention relates to memory devices having laterally constricted phase change materials or electrodes of different widths, wherein narrow portions of the lateral constrictions or narrow electrodes are on opposing sides of the memory device and to the fabrication of such memory devices.

BACKGROUND

Phase change random access memory (PCRAM) refers to a non-volatile memory device capable of recording and reading data according to an applied current. In a PCRAM device a volume of phase change material is deposited between two electrodes to form a single memory cell. Phase change materials are used in electronic memory applications because of their ability to electrically switch between an amorphous and crystalline state. These materials selectively exhibit more than one value of electrical resistivity. For example, when the phase change material is in a crystalline state its resistance is low, and when it is in an amorphous state its resistance is high.

In a PCRAM device, a programming current is passed through the phase change material to induce a phase change. This programming current generates heat as a result of the electrical resistance of the phase change material. The amount of heat generated is proportional to the current density in a fixed volume of material. As the volume of material is decreased the programming current required to induce the phase change also decreases. Furthermore, as the programming current is reduced the amount of heat generated also decreases.

Since each memory cell utilizes a programming current, and there are millions of memory cells per PCRAM device, a large overall energy input is required to operate the device. It is desirable to reduce the amount of programming current required to induce the phase change and, in so doing, reduce the total energy requirements of the device.

Additionally, there is an increasing need to produce ever-smaller memory devices. As memory devices are condensed, the relative distance between neighboring memory cells is lessened, resulting in cells of extremely close proximity. It is theorized that cells in such close proximity will be subject to increased thermal influence from adjacent cells. This phenomenon is known as "thermal cross-talk." Thermal cross-talk occurs when heat generated in one memory cell, by application of the programming current, is thermally conducted to an adjacent memory cell.

Thermal cross-talk is undesirable because it can cause an unwanted phase change in a memory cell, resulting in corruption of the data stored within the memory cell. Transitions between the amorphous and crystalline states may be initiated by temperature change. If thermal cross-talk is not prevented, it is possible that the phase change material of an unselected cell, one to which current is not applied, will be transformed (i.e., inadvertently programmed to an incorrect state) due to heat transfer from an adjacent cell. It would be desirable to form a device capable of operating with reduced energy draw and negligible thermal cross-talk despite minimal scale and high cell density.

U.S. Patent Application Publication No. 2007/0181932 to Happ et al. describes a method of thermally isolating phase change memory cells. Adjacent phase change memory cells are separated from one another by first and second insulating materials. The phase change materials in the phase change memory cells have an hourglass or tapered shape.

DETAILED DESCRIPTION

Figure 1:
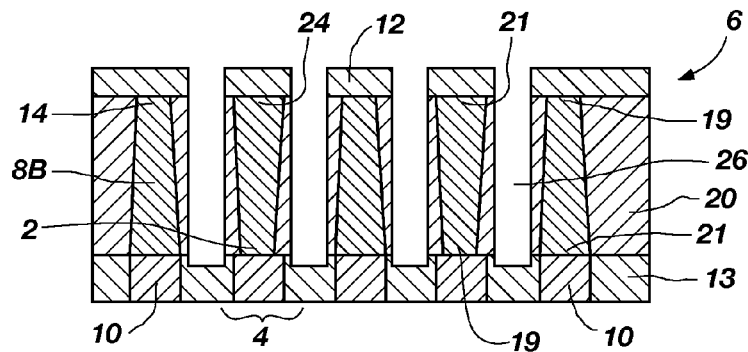
FIGS. 1-5 are cross-sectional views of memory devices in accordance with embodiments of the invention.

A plurality of memory cells having an increased distance between programmable volumes of adjacent memory cells is disclosed. The plurality of memory cells may be utilized in a memory device, such as a PCRAM device. The PCRAM device may include a phase change material as the electrically switchable (programmable) material. The phase change material may be configured in the PCRAM device as a phase change material element. By increasing the distance between adjacent programmable volumes, thermal cross-talk between the memory cells is reduced. To increase this distance, the location of the programmable volumes 2 of the adjacent memory cells 4 on the memory devices 6, 6', 6", 6''' are vertically staggered or offset relative to one another, as illustrated in FIGS. 1-4. Each memory cell 4 includes a phase change material element 8B disposed between two electrodes, such as between a bottom electrode 10 and a top electrode 12. The memory cells 4 are arranged in an array. By way of non-limiting example, the programmable volume 2 of one memory cell 4 may be proximate the bottom electrode 10 while the programmable volume 2 of another, adjacent memory cell 4 may be proximate the top electrode 12.

Figure 2:
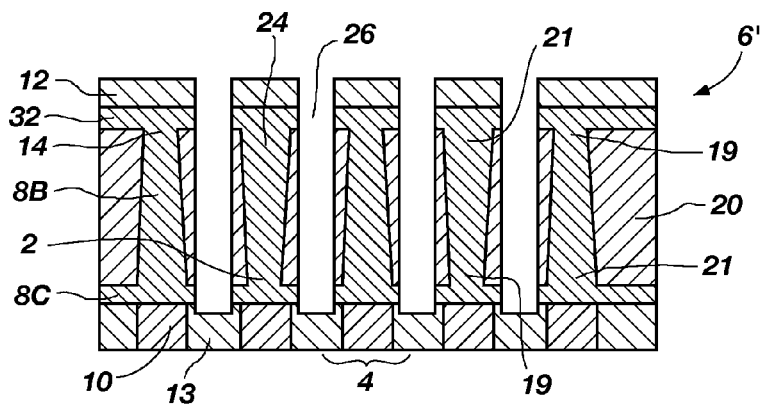
Figure 3:
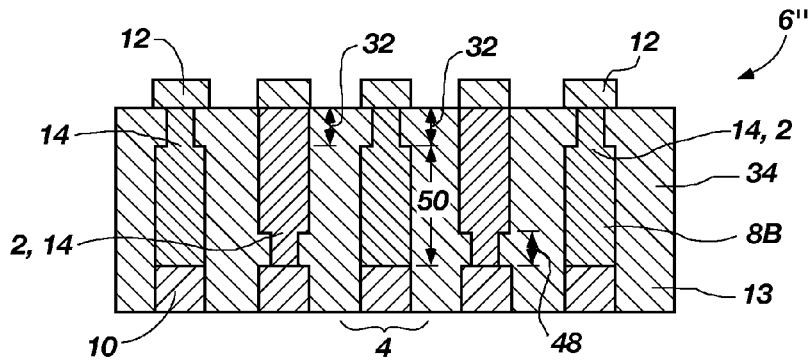
Figure 4:
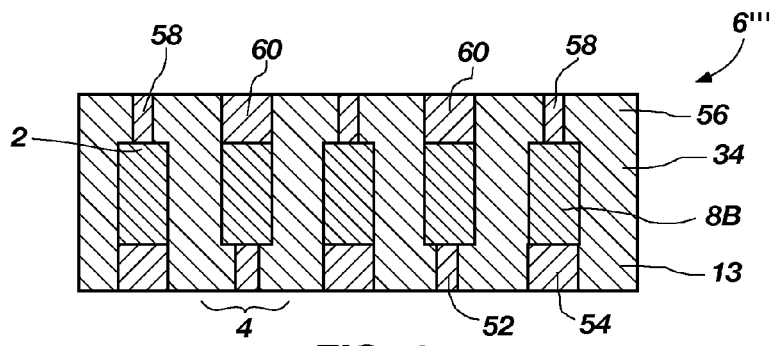

In one embodiment, the phase change material element 8B may include a laterally constricted portion 14 thereof, as illustrated in FIGS. 1-3. The phase change material element 8B includes a narrowing or constriction in the vertical direction of the memory cell 4. The laterally constricted portion 14 may be located at an interface of the phase change material element 8B and the bottom electrode 10 or top electrode 12, as illustrated in FIG. 1, or at a location within the phase change material element 8B, as illustrated in FIGS. 2 and 3. The laterally constricted portion 14 may substantially correspond to the programmable volume 2 of the memory cell 4. In another embodiment, which is illustrated in FIG. 4, bottom electrode 52, 54 or top electrode 58, 60 may have a smaller width than the width of the phase change material element 8B.

As used herein, the term "programmable volume" means and includes a portion of the phase change material at the laterally constricted portion thereof that electrically switches between an amorphous state and crystalline state when a current is applied to the phase change material. The programmable volume may be in direct or indirect contact with the bottom or top electrode of the memory cell. If the phase change material does not include a laterally constricted portion thereof, the term "programmable volume" means and includes a portion of the phase change material in contact with the bottom or top electrode.

As used herein, the terms "bottom," "top," "upper," and "lower" are relative terms and describe positions in relation to a substrate upon which the memory device is formed. The terms "top" or "upper" refer to a position distant from the substrate, and the terms "bottom" or "lower" refer to a position in close proximity to the substrate. By way of non-limiting example, the phrases "bottom electrode" and "top electrode" are relative terms and mean and include the location of a conductive material of the electrode with respect to the substrate. "Bottom electrode" describes an electrode which is proximal to the substrate, while "top electrode" refers to an electrode which is distal to the substrate.

As used herein, the phrase "phase change material" means and includes a chalcogenide compound that includes a chalcogen ion and an electropositive element. The chalcogen ion of the phase change material may be oxygen (O), sulfur (S), selenium (Se), tellurium (Te), or polonium (Po). The electropositive element may include, but is not limited to, nitrogen (N), silicon (Si), nickel (Ni), gallium (Ga), germanium (Ge), arsenic (As), silver (Ag), indium (In), tin (Sn), antimony (Sb), gold (Au), lead (Pb), bismuth (Bi), aluminum (Al), palladium (Pd), cobalt (Co), platinum (Pt), or combinations thereof. The chalcogenide compound may be a binary, ternary, or quaternary compound or alloy of these elements. By way of non-limiting example, the chalcogenide compound may include the following combinations of elements:

Ge—Te, In—Se, Sb—Te, Sb—Se, Ga—Sb, Ge—Sb, In—Sb, As—Te, Al—Te, Si—Sb, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Ge—Sb—Se, In—Sb—Se, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, or Ge—Te—Sn—Pt.

The stoichiometry of the elements in the above-mentioned chalcogenide compounds is not limited. As such, any known stoichiometry of elements in the above-mentioned chalcogenide compounds may be used. In one embodiment the chalcogenide compound is a compound of Ge, Sb, and Te (a GST material), such as $Ge_2Sb_2Te_5$, $Ge_8Sb_{32}Te_{56}$ (also known as $Ge_1Sb_4Te_7$), $Ge_{14}Sb_{28}Te_{56}$ (also known as $Ge_1Sb_2Te_4$), $Ge_{40}Sb_9Te_{51}$, $Ge_{44}Sb_5Te_{51}$, $Ge_{28}Sb_{27}Te_{45}$, $Ge_{58}Sb_{19}Te_{23}$, $Ge_{17}Sb_{27}Te_{56}$, or $Ge_{30}Sb_{17}Te_{53}$. In another embodiment, the chalcogenide compound is $Te_{81}Ge_{15}Sb_2S_2$ or $Sb_2Te_3$.

Figure 5:
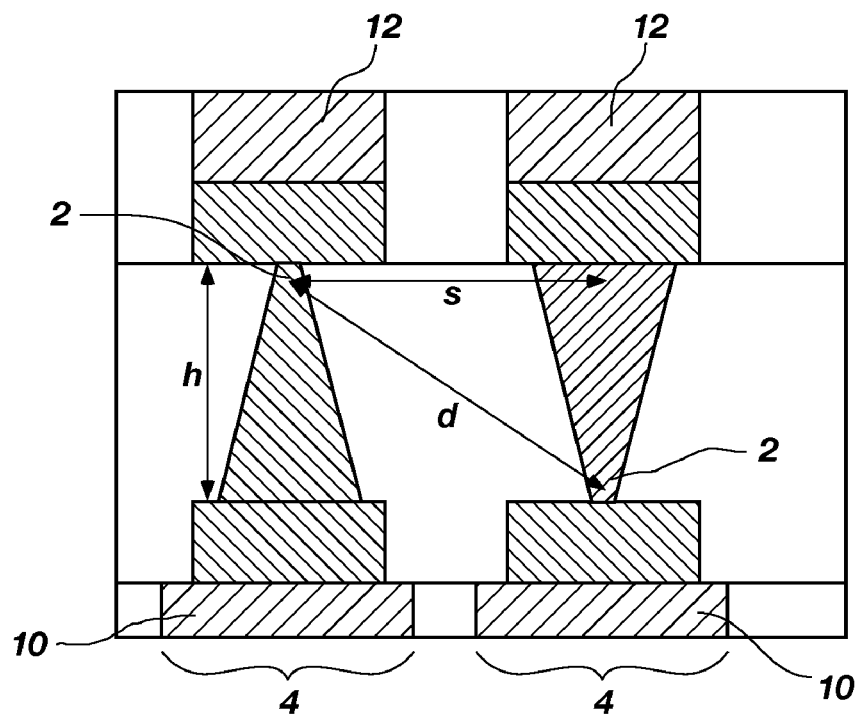

The programmable volumes 2 of the adjacent memory cells 4 are vertically offset relative to one another, as shown in FIGS. 1-4. Stated another way, programmable volumes 2 of adjacent memory cells 4 are positioned on opposite sides of the memory devices 6, 6', 6", 6'". As shown in further detail in FIG. 5, the memory cells 4 have a bit-to-bit distance (or thermal distance) d, a height h, and a space s. The bit-to-bit distance d is the distance between programmable volumes 2 of adjacent memory cells 4, the height h is the length of the phase change material, and the space s is the horizontal distance between the centers of adjacent memory cells 4. As the size of memory devices 6, 6', 6", 6'" continues to decrease, the height h may range from approximately 20 nm to approximately 40 nm and the space s may range from approximately 20 nm to approximately 40 nm. By way of non-limiting example, when the space s is approximately 20 nm, the height h is from approximately 20 nm to approximately 40 nm. The bit-to-bit distance d is calculated as the square root of $(h^2+s^2)$. By way of non-limiting example, if s is 20 nm and h is 30 nm, d is approximately 36 nm. In contrast, the bit-to-bit distance d of a conventional memory device, in which the programmable volumes of adjacent memory cells are on the same vertical plane as one another, is equal to the horizontal distance between the programmable volumes of the adjacent memory cells. In other words, in a conventional memory device where s is 20 nm and h is 30 nm, the bit-to-bit distance d is 20 nm.

The embodiments of the present invention may be practiced in conjunction with conventional techniques employed in semiconductor fabrication to produce the desired memory devices 6, 6', 6", 6'". While the following description provides specific details, such as material types, material dimensions and processing conditions in order to provide a thorough description of embodiments of the present invention, a person of ordinary skill in the art will understand that the embodiments of the present invention may be practiced without employing these specific details. In addition, the description provided herein does not form a complete process flow for manufacturing a PCRAM device, and the PCRAM device described below does not form a complete semiconductor device. Only those process acts and structures necessary to understand the embodiments of the present invention are described in detail below. Additional acts to faun a complete semiconductor device including the PCRAM device may be performed by conventional techniques.

The illustrations presented herein are not meant to be actual views of any particular PCRAM devices, but are merely idealized representations which are employed to describe embodiments of the present invention. In addition, the illustrations are not drawn to scale. Elements and features common between figures may retain the same numerical designation.

To form the memory devices 6, 6', 6", 6'", the bottom electrode 10 may be a so-called "plug" in a dielectric material 13, as illustrated in FIGS. 1-4. The dielectric material 13 may be formed from a suitable insulative or dielectric material, such as an oxide or a nitride. By way of non-limiting example, the dielectric material 13 may be plasma-enhanced CVD ("PECVD") $SiO_z$, where z is 1 or 2, PECVD silicon nitride, or standard thermal CVD $Si_3N_4$. The dielectric material 13 and the bottom electrode 10 may be formed over a substrate (not shown), such as a conventional silicon substrate or other bulk substrate including a layer of semiconductor material. As used herein, the term "bulk substrate" includes not only silicon wafers, but also silicon-on-insulator ("SOI") substrates, silicon-on-sapphire ("SOS") substrates, epitaxial layers of silicon on a base semiconductor foundation, and other semiconductor or optoelectronic materials, such as silicon-germanium, germanium, gallium arsenide, or indium phosphide. The substrate may be doped or undoped. To form the bottom electrode 10 as a plug, the dielectric material 13 may be patterned to form apertures, which are filled with the conductive material of the bottom electrode 10. The conductive material may include, but is not limited to, W, Ni, tantalum nitride (TaN), Pt, tungsten nitride (WN), Au, titanium nitride (TiN), or titanium aluminum nitride (TiAlN). The bottom electrode 10 may be formed by a conventional deposition technique, such as by chemical vapor deposition (CVD) or physical vapor deposition (PVD). Portions of the conductive material overlying the dielectric material 13 may be removed, such as by CMP.

Figure 6:
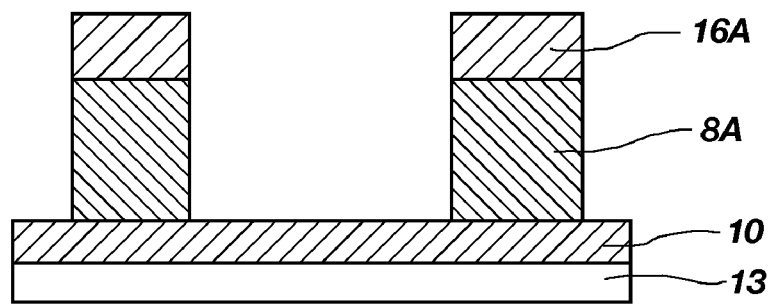
FIGS. 6-14 are cross-sectional views illustrating the fabrication of the memory device of FIG. 1.

Alternatively, the conductive material of the bottom electrode 10 may be formed as a layer or other three-dimensional configuration over the dielectric material 13, as illustrated in FIG. 6. FIG. 6 illustrates the conductive material of the bottom electrode 10 configured as a layer, along with a patterned phase change material element 8A and a patterned mask material 16A. As described in detail below, after forming the conductive material of the top electrode 12 as a layer, the bottom electrode 10 and the top electrode 12 may be etched in situ by conventional photolithography techniques to form the memory cells 4. While the majority of the drawings herein illustrate forming the conductive material of the bottom electrode 10 as a plug in the dielectric material 13, additional embodiments are contemplated wherein the conductive material is formed as a layer.

Figure 7:
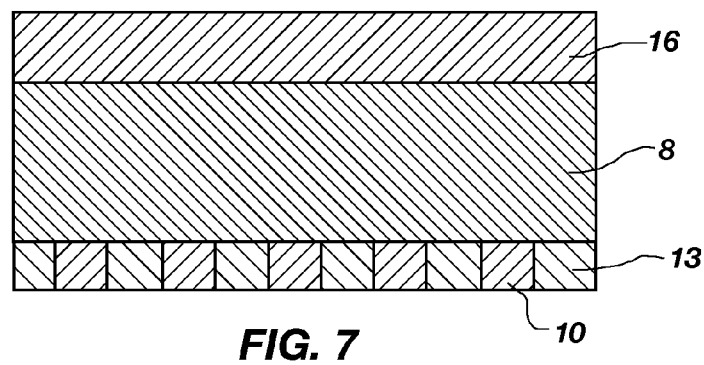
Figure 8:
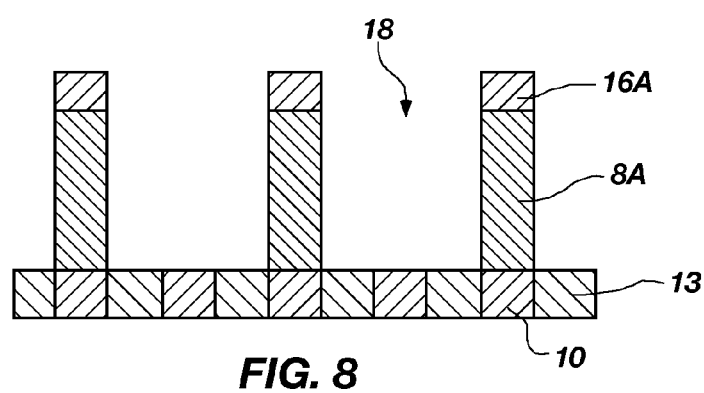

To form the memory device 6 of FIG. 1, the phase change material 8 may be formed over and in contact with the dielectric material 13 and the bottom electrode 10, as shown in FIG. 7. The phase change material 8 may be formed by a conventional technique including, but not limited to, CVD or PVD. However, other deposition techniques known in the art may also be used. The phase change material 8 may have a thickness from about 100 Angstroms (Å) to about 1000 Å. A mask material 16 may be applied over the phase change material 8. The mask material 16 may be a conventional photoresist material and may be selected by a person of ordinary skill in the art. The mask material 16 may be developed and etched to form a desired pattern, which is transferred to the phase change material 8 to form patterned phase change material 8A and a plurality of trenches 18 therein, as shown in FIG. 8. The plurality of trenches 18 are defined by sidewalls of the patterned phase change material 8A. The mask material 16 may also be a hard mask formed from a material including, but not limited to, amorphous carbon or transparent carbon, or silicon oxide. The patterned phase change material 8A may have a height of from about 100 Å to about 1000 Å, such as about 600 Å, and a width of from about 50 Å to about 500 Å, such as about 250 Å. The patterned phase change material 8A may have any geometrical cross-sectional shape, such as circular, rectangular, or elliptical, for example. The trenches 18 may be formed by etching the mask material 16 and the phase change material 8 using a single etch or multiple etches, such as by etching the mask material 16 and then the phase change material 8. Depending on the materials used, the mask material 16 and the phase change material 8 may be etched using a dry etch process, a wet etch process, or combinations thereof. The etching of the mask material 16 and the phase change material 8 may be conducted using conventional etch chemistries, which are not described in detail herein. The etch chemistry may be selected by a person of ordinary skill in the art based on the materials used. By way of non-limiting example, the mask material 16 and the phase change material 8 may be etched by reactive-ion etching or plasma etching. The etchant may be any one of $CF_4$, $CHF_3$, $CH_2F_2$, $C_2F_6$, $CCl_4$, $Cl_2$, or $C_4F_8$. In one embodiment the etchant is $CF_4$.

Figure 9:
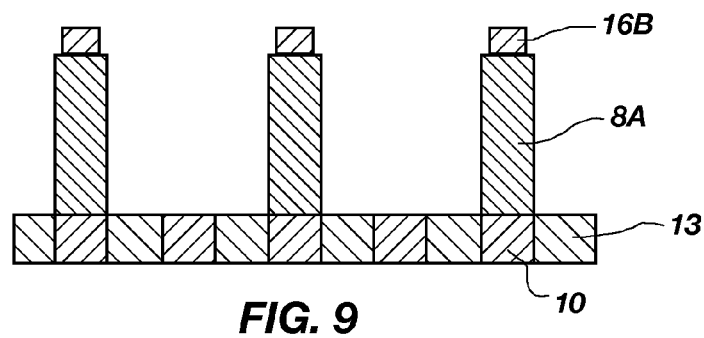

The patterned mask material 16A may be selectively removed or trimmed, as illustrated in FIG. 9. The vertical thickness and lateral width of the trimmed mask material 16B may be reduced relative to its previous thickness and width. The width of the trimmed mask material 16B may be approximately equal to a desired width of a laterally constricted phase change material 8B at its narrowest cross-sectional area (see FIG. 10). Trimming the patterned mask material 16A may be accomplished by conventional techniques, such as by an isotropic etch process. Selection of the isotropic etchant may depend on the material used as the mask material 16 and may be determined by a person of ordinary skill in the art. By way of non-limiting example, the patterned mask material 16A may be isotropically etched using, for example hydrofluoric acid or $CF_4$.

Figure 10:
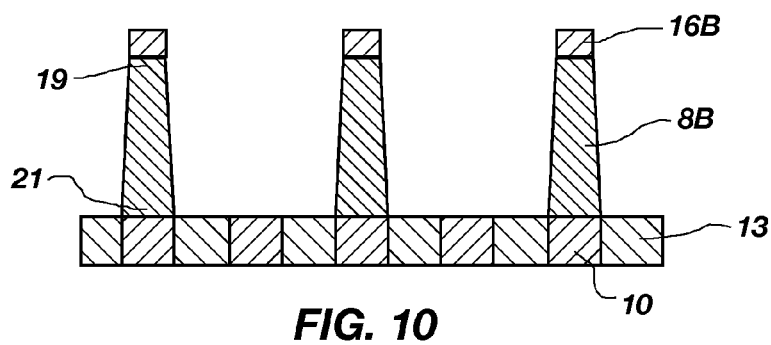

The patterned phase change material 8A underlying the trimmed mask material 16B may be anisotropically etched using the trimmed mask material 16B as an etch mask, as shown in FIG. 10. By way of non-limiting example, the patterned phase change material 8A may be anisotropically etched using a dry etch. Portions of the patterned phase change material 8A may be removed to form laterally constricted phase change material 8B, which has substantially non-vertical or sloping sidewalls. In memory device 6, the laterally constricted phase change material 8B may have a substantially tapered or frustoconical shape. As such, a first end 19 of the laterally constricted phase change material 8B may have a decreased width compared to a second end 21 of the laterally constricted phase change material 8B.

Figure 11:
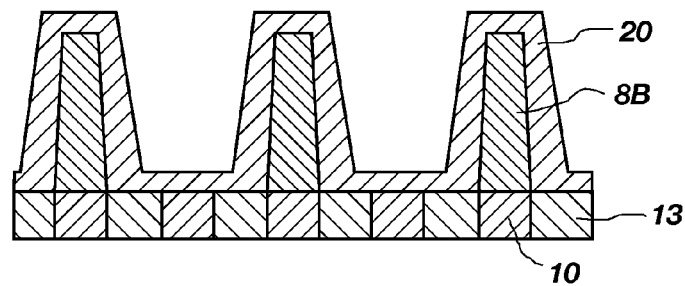
Figure 12:
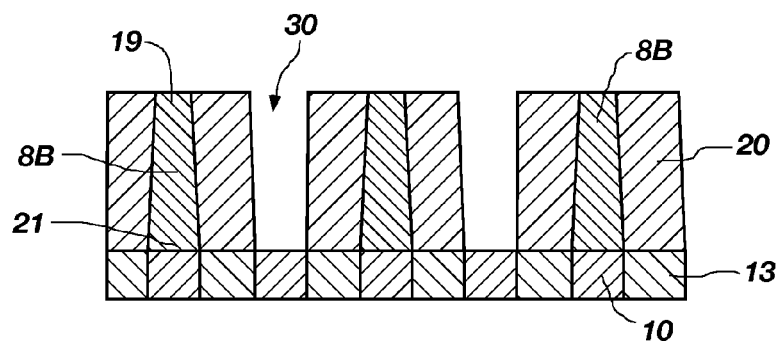

The trimmed mask material 16B may be removed using a conventional etchant, which may be selected based on the material used. An insulating material 20 may be formed conformally over exposed surfaces of the laterally constricted phase change material 8B, the dielectric material 13, and the bottom electrode 10, as shown in FIG. 11. The insulating material 20 may be any material known in the art to have dielectric properties and to be capable of being deposited conformally. The insulating material 20 may be deposited by any known deposition technique, such as atomic layer deposition ("ALD"), which may be used for conformal deposition. The insulating material 20 may be, for example, an ALD oxide, an ALD nitride, or silicon oxynitride. Horizontal portions of the insulating material 20, such as those disposed on an upper surface of the bottom electrode 10 and on an upper surface of the laterally constricted phase change material 8B, may be removed, as shown in FIG. 12. These horizontal portions may be removed by conventional techniques, which are not described in detail herein. Removing these horizontal portions of the insulating material 20 may expose an upper surface of the laterally constricted phase change material 8B and the upper surface of the bottom electrode 10, forming spaces 30 defined by sidewalls of the insulating material 20 and the upper surface of the bottom electrode 10. Since the insulating material 20 is conformally deposited on the laterally constricted phase change material 8B, the spaces 30 are bounded by non-vertical or sloping sidewalls.

Figure 13:
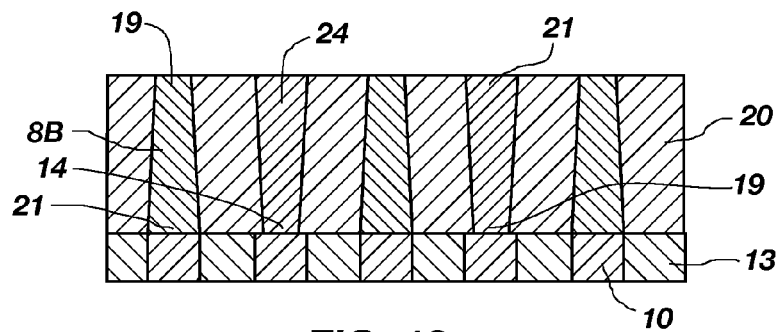

The spaces 30 may be filled with fill phase change material 24, as shown in FIG. 13. The fill phase change material 24 may be one of the materials previously described and may be the same as or different than the material used as phase change material 8. The fill phase change material 24 may include different combinations of elements than the phase change material 8. Alternatively, the fill phase change material 24 may include the same elements but have a different stoichiometry than the phase change material 8. If the same material is used for the phase change material 8 and the fill phase change material 24, adjacent memory cells may have the same programming current. By utilizing different materials for the phase change material 8 and the fill phase change material 24, adjacent memory cells may have different programming currents. Depending on the cross-sectional contact area of the phase change material element 8B and the fill phase change material 24 with the electrodes (electrodes 10, 12, 52, 54, 58, or 60), the materials used for the phase change material 8 and the fill phase change material 24 may be selected to provide similar programming currents for adjacent memory cells. The spaces 30 may be filled with the fill phase change material 24 by a conventional technique. Portions of the fill phase change material 24 overlying the insulating material 20 and the laterally constricted phase change material 8B may be removed by conventional techniques, such as by chemical mechanical planarization ("CMP"), to expose the fill phase change material 24 and the insulating material 20. Since the spaces 30 have sloping sidewalls, the fill phase change material 24 formed in the spaces 30 also has sloping sidewalls and the laterally constricted portion 14.

Figure 14:
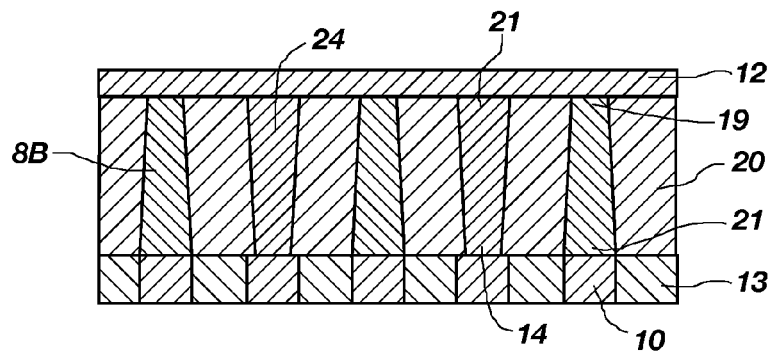

The top electrode 12 may then be formed overlying the exposed surfaces of the insulating material 20, the laterally constricted phase change material 8B, and the fill phase change material 24, as shown in FIG. 14. The top electrode 12 may be formed from one of the conductive materials previously described for use as the bottom electrode 10. The top electrode 12 and underlying portions of the insulating material 20 may be etched by conventional photolithography techniques to expose portions of the dielectric material 13, forming the memory cells 4 shown in FIG. 1. By way of non-limiting example, a photoresist material (not shown) may be applied over the top electrode 12, and developed and etched according to conventional photolithographic techniques. If the bottom electrode 10 was formed as a layer, the bottom electrode 10, the top electrode 12, and the underlying portions of the insulating material 20 may be etched in situ by conventional photolithography techniques to form the memory cells 4. The adjacent memory cells 4 may be separated by an air gap 26. Alternatively, the air gap 26 may be filled with an insulative material (not shown), such as a silicon oxide, a silicon nitride, or a material having a low thermal conductivity.

In the memory device 6 of FIG. 1, the laterally constricted portions 14 of the laterally constricted phase change material 8B and the fill phase change material 24 are in direct contact with the top electrode 12 and the bottom electrode 10, respectively. The laterally constricted portions 14 correspond to the programmable volumes 2 of the memory cells 4. The laterally constricted phase change material 8B may have a shape that is a reverse image of the shape of the fill phase change material 24. Since the laterally constricted phase change material 8B and the fill phase change material 24 have inverted taper shapes of opposing orientations, the bit-to-bit distance d between the programmable volumes 2 of adjacent memory cells 4 is maximized.

Figure 15:
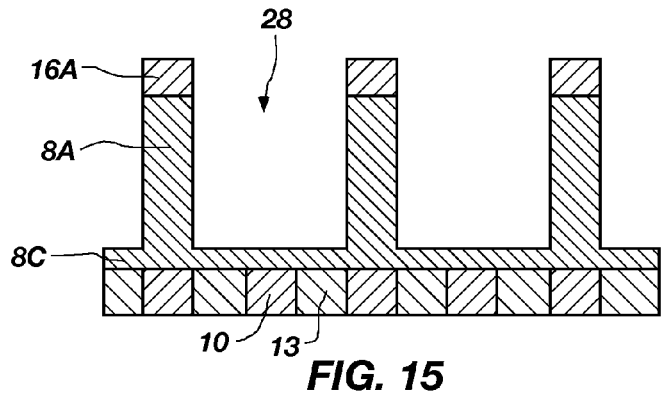
FIGS. 15-21 are cross-sectional views illustrating the fabrication of the memory device of FIG. 2.
Figure 16:
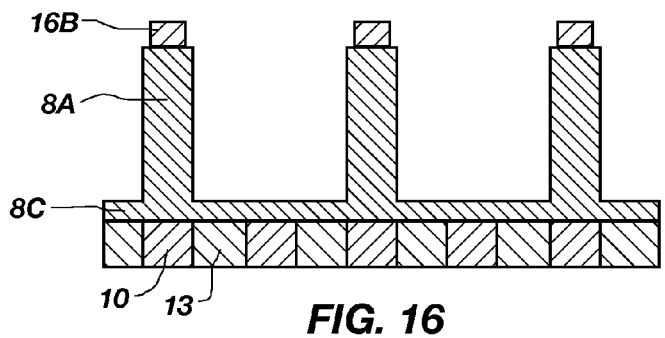
Figure 17:
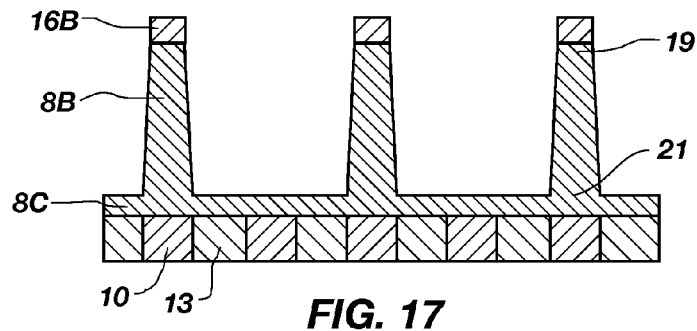

To form the memory device 6' of FIG. 2, the mask material 16, the phase change material 8, the bottom electrode 10, and the dielectric material 13 may be formed as shown in FIG. 7. These materials may be formed as previously described in regard to FIG. 7. The mask material 16 and the phase change material 8 may be patterned, as shown in FIG. 15. Patterning of the mask material 16 and the phase change material 8 may be conducted as previously described in regard to FIG. 8, except that a portion of the phase change material 8C remains over a top surface of the bottom electrode 10 and the dielectric material 13 in addition to the patterned phase change material 8A. As such, the bottom electrode 10 and the dielectric material 13 are not exposed. The partial removal of the phase change material 8 may be accomplished by conventional etching techniques, which are not described in detail herein. Patterning of the mask material 16 and phase change material 8 produces openings 28, which are defined by a bottom surface of the phase change material 8C and substantially vertical sidewalls of the patterned phase change material 8A. The patterned mask material 16A may be trimmed, as shown in FIG. 16. Trimming of the mask material 16 may be accomplished as previously described in regard to FIG. 9. The trimmed mask material 16B may be used as an etch mask to anisotropically etch the patterned phase change material 8A, producing laterally constricted phase change material 8B, which corresponds to phase change material element 8B, as shown in FIG. 17. The first end 19 of the laterally constricted phase change material 8B may have a decreased width compared to the second end 21 of the laterally constricted phase change material 8B. The anisotropic etch of patterned phase change material 8A may be conducted as previously described in regard to FIG. 10. The phase change material 8C may be substantially unaffected by the anisotropic etch.

Figure 18:
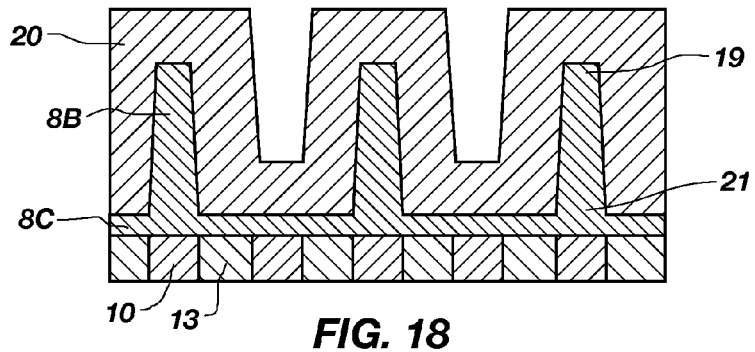
Figure 19:
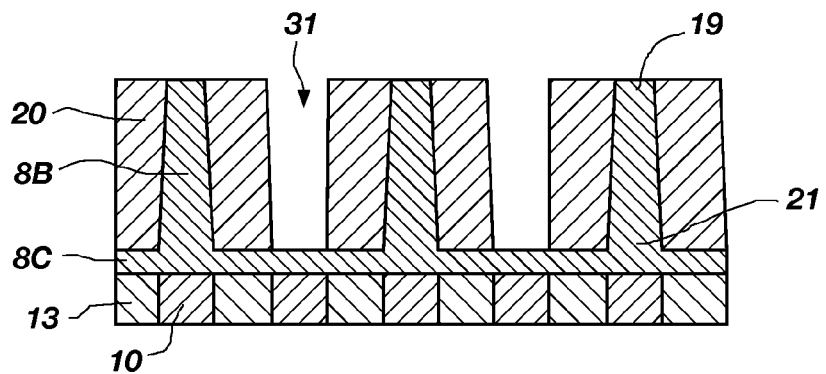
Figure 20:
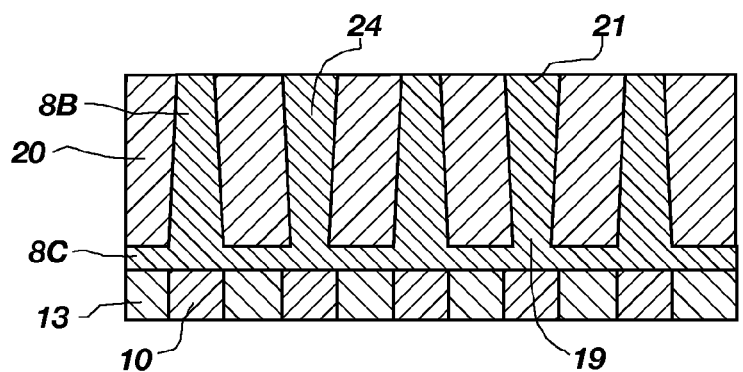
Figure 21:
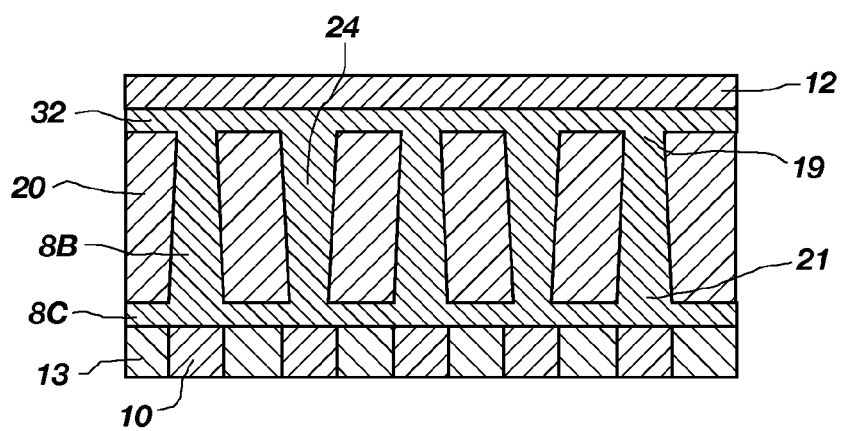

The trimmed mask material 16B may be removed and the insulating material 20 formed conformally over the exposed surfaces of the laterally constricted phase change material 8B and phase change material 8C, as shown in FIG. 18. The formation of the insulating material 20 may be conducted as previously described in regard to FIG. 11. Horizontal portions of the insulating material 20, such as those disposed on the top surface of the laterally constricted phase change material 8B and phase change material 8C, may be removed, forming spaces 31 defined by the substantially non-vertical or sloping sidewalls of the insulating material 20 and the top surface of the phase change material 8C, as shown in FIG. 19. The removal of the horizontal portions of the insulating material 20 may be conducted as previously described in regard to FIG. 12. The spaces 31 may be filled with the fill phase change material 24, as shown in FIG. 20. Filling the spaces 31 may be conducted as previously described in regard to FIG. 13. Another phase change material 32 may be formed over the exposed surfaces of the laterally constricted phase change material 8B, the insulating material 20, and the fill phase change material 24, as shown in FIG. 21. The another phase change material 32 may be one of the materials previously described and may be the same or different than the phase change material 8 or fill phase change material 24. The another phase change material 32 may form a substantially planar layer over the laterally constricted phase change material 8B, the insulating material 20, and the fill phase change material 24.

The top electrode 12 may then be formed overlying the another phase change material 32. The top electrode 12 may be formed as previously described in regard to FIG. 14. As shown in FIG. 2, the top electrode 12 and underlying portions of the insulating material 20, the another phase change material 32, and the phase change material 8C may be etched by conventional techniques to expose portions of the dielectric material 13 and form the memory cells 4. The adjacent memory cells 4 may be separated by an air gap 26. Alternatively, the air gap 26 may be filled with an insulative material (not shown), such as silicon oxide, a silicon nitride, or a material having a low thermal conductivity.

In the memory device 6' of FIG. 2, the laterally constricted portions 14 of the laterally constricted phase change material 8B and the fill phase change material 24 are in direct contact with the phase change material 8C and the another phase change material 32, rather than directly contacting the bottom electrode 10 and the top electrode 12. The phase change material 8C and the another phase change material 32 are in substantial contact with the bottom electrode 10 and the top electrode 12, respectively. The laterally constricted portions 14 correspond to the programmable volumes 2 of the memory cells 4. The fill phase change material 24 may have a shape that is a reverse image of the shape of the laterally constricted phase change material 8B. Since the laterally constricted phase change material 8B and the fill phase change material 24 have alternating, inverted taper shapes of opposing orientations, the bit-to-bit distance d between the programmable volumes 2 of adjacent memory cells 4 is maximized.

The memory devices 6, 6' of FIGS. 1 and 2 may be fabricated using two photomask processes. In one embodiment, a first photomask process is utilized to pattern the phase change material 8 and the mask material 16 while the second photomask process is utilized to pattern the bottom and top electrodes 10, 12 in situ. In a second embodiment, a first photomask process is utilized to pattern at least a portion of the phase change material 8 and the mask material 16 while the second photomask process is utilized to pattern the bottom and top electrodes 10, 12 in situ. Since fabrication of a conventional memory device (in which the programmable volumes of adjacent memory cells are on the same vertical plane as one another) also utilizes two photomask processes, one photomask process to pattern the bottom electrode and the other photomask process to pattern the memory cell and the top electrode, fabrication of the memory devices 6, 6' may be accomplished without utilizing additional process acts.

Figure 22:
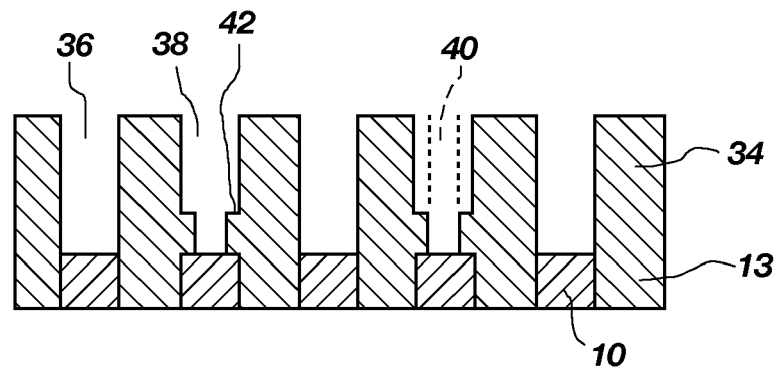
FIGS. 22-24 are cross-sectional views illustrating the fabrication of the memory device of FIG. 3.

To form the memory device 6" of FIG. 3, plugs of the bottom electrode 10 may be formed in the dielectric material 13 as previously described in regard to FIG. 7. Additional dielectric material 34 may then be formed over the dielectric material 13 and the bottom electrode 10, and alternating wide apertures 36 and partially constricted wide apertures 38 formed therein, as shown in FIG. 22. The wide apertures 36 and partially constricted wide apertures 38 may be formed over the bottom electrode 10. The wide apertures 36 and partially constricted wide apertures 38 may be formed using conventional photolithography techniques followed by a dry etch process. By way of non-limiting example, a mask (not shown) may be used to produce the wide apertures 36 and narrow apertures 40 (shown in dashed lines). A portion of the narrow apertures 40 may be subsequently widened to form the partially constricted wide apertures 38. The width of the partially constricted wide apertures 38 at their widest point may be substantially the same as the width of the wide apertures 36. By way of non-limiting example, a top portion of the narrow apertures 40 may be widened to form a lateral shelf 42 while a width of a bottom portion of the alternating narrow apertures 40 may remain substantially unaffected while masking the partially constricted wide apertures 38. The lateral shelf 42 may provide the laterally constricted portion 14 to the partially constricted wide apertures 38.

Figure 23:
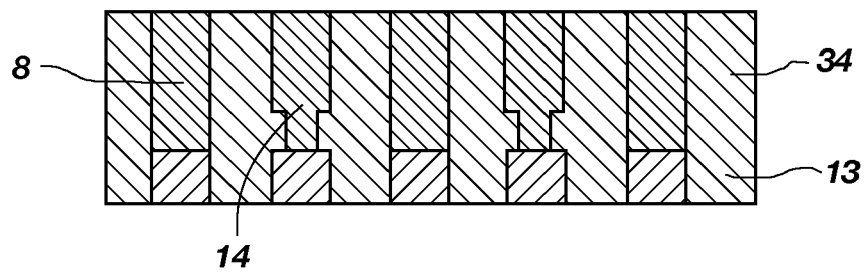

Alternatively, a mask (not shown) may be used to produce narrow apertures 40 in the dielectric material 13 overlying alternating bottom electrodes 10 by conventional photolithography techniques. The width of all or a portion of the narrow apertures 40 may then be increased, producing the wide apertures 36 and the partially constricted wide apertures 38, respectively. To faun the wide apertures 36, the width of the alternating narrow apertures 40 may be widened. The alternating narrow apertures 40 may be widened by masking (not shown) those narrow apertures 40 that are not to be widened. Alternatively, those narrow apertures 40 that are not to be widened may be filled with a sacrificial material (not shown). The narrow apertures 40 that are to be widened may then be subjected to an anisotropic etch while those narrow apertures 40 that are not to be widened are protected by the mask or sacrificial material. The mask or sacrificial material may subsequently be removed by conventional techniques. To form the partially constricted wide apertures 38, a top portion of the alternating narrow apertures 40 may be widened to form the lateral shelf 42 while a width of a bottom portion of the alternating narrow apertures 40 may remain substantially unaffected while masking the partially constricted wide apertures 38. The lateral shelf 42 may provide the laterally constricted portion 14 to the partially constricted wide apertures 38. The phase change material 8 may be deposited in the wide apertures 36 and the partially constricted wide apertures 38, as shown in FIG. 23. The phase change material 8 may be one of the materials previously described and may be deposited in the wide apertures 36 and the partially constricted wide apertures 38 by conventional techniques. Portions of the phase change material 8 overlying the dielectric material 13 may be removed, such as by CMP.

Figure 24:
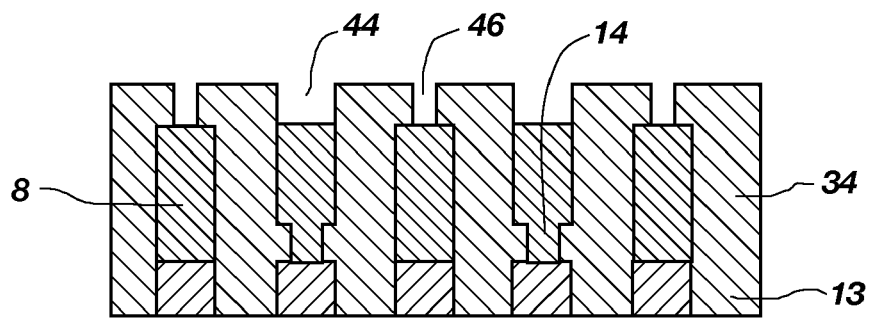

Alternating wide apertures 44 and narrow apertures 46 may then be formed as shown in FIG. 24. The wide apertures 44 may be formed over the phase change material 8 having the laterally constricted portion 14 therein while the narrow apertures 46 may be formed over the phase change material 8 lacking the laterally constricted portion 14. The wide apertures 44 and narrow apertures 46 may be formed by removing a portion of the phase change material 8. Alternatively, additional dielectric material (not shown) may be formed over the dielectric material 13 and phase change material 8 and portions of the additional dielectric material are removed to form the wide apertures 44 and narrow apertures 46. The wide apertures 44 and narrow apertures 46 may then be filled with the another phase change material 32, as shown in FIG. 3. The another phase change material 32 may be one of the materials previously described and may be the same or different than the phase change material 8. The conductive material may be formed over the phase change material 8 and the another phase change material 32 and etched to form the top electrode 12, as shown in FIG. 3.

As shown in FIG. 3, phase change material 8 and the another phase change material 32 of the memory cells 4 of the memory device 6" may include a first portion 48 and a second portion 50, where the width of the second portion 50 may be greater than that of the first portion 48, forming a so-called "Y-shape". Adjacent memory cells 4 may have alternating Y-shapes. An interface of the first portion 48 and the second portion 50 may produce the laterally constricted portion 14 of the phase change material 8. The first portion 48 and the second portion 50 correspond to phase change material element 8B. The laterally constricted portions 14 correspond to the programmable volumes 2 of the memory cells 4. The first portions 48 of adjacent memory cells 4 may be vertically staggered or offset in an alternating manner relative to one another and may, respectively, be in direct contact with one of the bottom electrode 10 and the top electrode 12. Since adjacent memory cells 4 have alternating, inverted Y-shapes, the bit-to-bit distance d between the programmable volumes 2 of adjacent memory cells 4 is maximized.

The laterally constricted portions 14 in memory device 6 ensure that the cross-sectional contact area of the laterally constricted phase change material 8B or fill phase change material 24 in contact with the bottom electrode 10 or top electrode 12 is minimized, which reduces the amount of current utilized to electrically switch the programmable volume 2 between the amorphous and crystalline states. In memory device 6", the decreased width of the first portion 48 of the phase change material 8 relative to the second portion 50 also provides a decreased cross-sectional contact area for contact with the bottom electrode 10 or the top electrode 12. In memory devices 6', 6", by positioning the laterally constricted portions 14 such that the laterally constricted portions 14 do not directly contact the bottom or top electrodes 10, 12, heat loss between the programmable volume 2 and the bottom or top electrodes 10, 12 is reduced. As such, an interface between the programmable volume 2 and the bottom or top electrodes 10, 12 remains cool during use and operation of the memory devices 6', 6", which improves the reliability thereof. In addition, the reduced transverse cross-sectional area of laterally constricted portions 14 increases the current density therethrough, reducing the amount of current utilized to electrically switch the programmable volume 2. The alternating, tapered shapes (in memory devices 6, 6') or alternating, Y-shapes (in memory device 6") serve to maximize the bit-to-bit distance d between adjacent memory cells 4 during use and operation of the memory devices 6, 6', 6", reducing heat transfer between adjacent memory cells 4 and consequential, unwanted phase changes.

To maximize the bit-to-bit distance d between adjacent memory cells 4 and minimize the contact area between the programmable volume 2 of the phase change material 8 and its associated one of the bottom and top electrodes, the memory device 6''' shown in FIG. 4 may be formed. The bottom and top electrodes of a single memory cell 4 may have different widths, such as a wide bottom electrode 54 and a narrow top electrode 58. The bottom and top electrodes of an adjacent memory cell 4 may be vertically staggered or offset in an alternating manner, such that each memory cell 4 has a narrow bottom electrode 52 and a wide top electrode 60 while a laterally adjacent memory cell has a wide bottom electrode 54 and a narrow top electrode 58, and vice versa.

Figure 25:
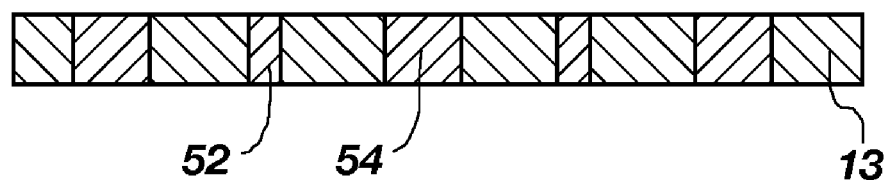
FIGS. 25 and 26 are cross-sectional views illustrating the fabrication of the memory device of FIG. 4.

To form the memory device 6''', the dielectric material 13 may be patterned to form alternating, laterally adjacent narrow apertures (not shown) and wide apertures (not shown) therein. The dielectric material 13 may be one of the materials previously described. The narrow apertures and wide apertures may be filled with the conductive material to form narrow bottom electrodes 52 and wide bottom electrodes 54, as shown in FIG. 25. The conductive material may be one of the materials previously described. Portions of the conductive material overlying top surfaces of the dielectric material 13 and the bottom electrodes 52, 54 may be removed, such as by CMP.

Figure 26:
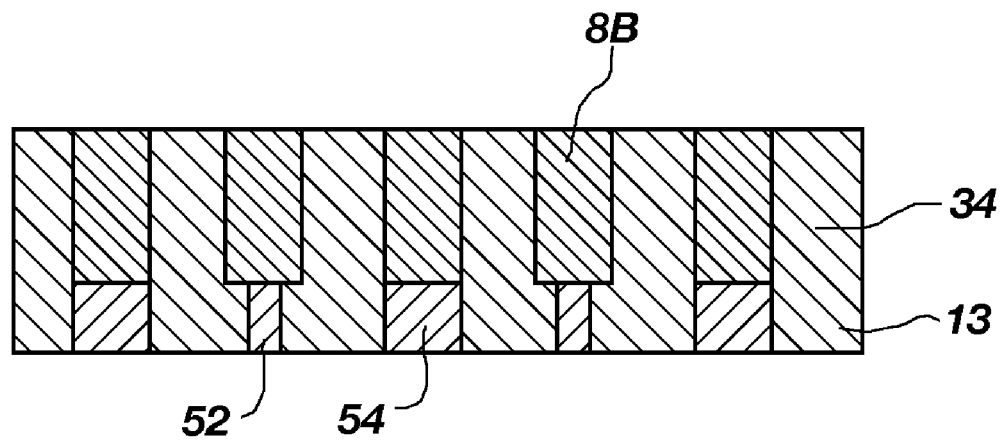

An additional dielectric material 34 may be applied over the bottom electrodes 52, 54 and the dielectric material 13. The additional dielectric material 34 may be the same as or different from the dielectric material 13. The additional dielectric material 34 may be patterned, as known in the art, to form a plurality of apertures (not shown) of equal width in the additional dielectric material 34. These apertures may be filled with the phase change material, forming phase change material element 8B as shown in FIG. 26. The phase change material may be one of the chalcogenide compounds previously described. An upper surface of the memory device may then be planarized using, for example, CMP. Alternatively, the phase change material may be deposited as a layer (not shown) over the bottom electrodes 52, 54 and the dielectric material 13, and patterned to form phase change material element 8B. The additional dielectric material 34 may then be applied and subjected to CMP, producing the structure shown in FIG. 26.

Another dielectric material 56 may be formed over the dielectric material 13 and the additional dielectric material 34. The another dielectric material 56 may be the same as or different from the dielectric materials 13, 34. The another dielectric material 56 may be patterned, as known in the art, to form a plurality of alternating, laterally adjacent narrow apertures (not shown) and wide apertures (not shown). The narrow apertures in the another dielectric material 56 may be formed over the memory cell locations having wide bottom electrodes 54, while the wide apertures in the another dielectric material 56 may be formed over the memory cell locations having narrow bottom electrodes 52. The narrow apertures and wide apertures may be filled with the conductive material to form narrow top electrodes 58 and wide top electrodes 60, as shown in FIG. 4. The conductive material may be one of the materials previously described and may be the same or different than the conductive material used for the bottom electrodes 52, 54. Portions of the conductive material overlying top surfaces of the another dielectric material 56, the narrow top electrodes 58, and the wide top electrodes 60 may be removed, such as by CMP.

Since the phase change material element 8B and the narrow electrodes (narrow top electrodes 58 or narrow bottom electrodes 52) have different widths, the surface area of the phase change material element 8B in contact with the narrow electrodes 52, 58 is minimized. As such, the amount of current utilized to electrically switch the programmable volume 2 between the amorphous and crystalline states is reduced. In addition, by alternating the locations of the narrow electrodes (narrow top electrode 58 or narrow bottom electrode 52), the bit-to-bit distance d between the programmable volumes 2 of adjacent memory cells 4 is maximized.

While the invention is susceptible to various modifications and alternative forms, specific embodiments have been shown by way of example in the drawings and have been described in detail herein. However, the invention is not limited to the particular forms disclosed. Rather, the invention encompasses all modifications, variations and alternatives falling within the scope of the invention as defined by the following appended claims and their legal equivalents.

What is claimed is:

1. A memory device, comprising:
   at least one first electrode;
   at least one second electrode; and
   a plurality of memory cells, each memory cell of the plurality of memory cells comprising a programmable volume, wherein the programmable volumes of adjacent memory cells are in alternating contact with the at least one first electrode or the at least one second electrode.

2. The memory device of claim 1, wherein the programmable volumes of adjacent memory cells are offset in an alternating manner by a distance of from approximately 20 nm to approximately 40 nm.

3. The memory device of claim 1, wherein adjacent memory cells are separated by an air gap.

4. The memory device of claim 1, wherein the programmable volumes are disposed within phase change material elements comprising a substantially frustoconical shape.

5. The memory device of claim 1, wherein the programmable volumes are disposed within phase change material elements comprising a substantially Y-shape.

6. The memory device of claim 1, wherein the programmable volumes are disposed within phase change material elements, each of the phase change material elements comprising a first end and a second end, the first end having a substantially similar cross section to the second end.

7. The memory device of claim 6, wherein each of the phase change material elements further comprises a laterally constricted portion between the first end and the second end, wherein the laterally constricted portions of adjacent memory cells are in alternating contact with the first end and the second end.

8. A memory device, comprising:
   a plurality of memory cells, each memory cell of the plurality of memory cells having a first electrode, a second electrode, and a programmable volume disposed therebetween, wherein widths of the first electrodes of adjacent memory cells are different from one another and widths of the second electrodes of adjacent memory cells are different from one another.

9. A method of forming a memory device, the method comprising:

forming at least one first electrode;

forming a plurality of memory cells over the at least one first electrode, each memory cell of the plurality of memory cells comprising a programmable volume, the programmable volumes of adjacent memory cells in alternating contact with the at least one first electrode or at least one second electrode; and forming at least one second electrode over the plurality of memory cells.

10. The method of claim 9, wherein forming a plurality of memory cells over the at least one first electrode comprises offsetting the programmable volumes of adjacent memory cells in an alternating manner by a distance of from approximately 20 nm to approximately 40 nm.

11. The method of claim 9, wherein forming a plurality of memory cells over the at least one first electrode comprises disposing the programmable volumes within phase change material elements, each of the phase change material elements comprising a first end and a second end, the first end having a substantially similar cross section to the second end.

12. The method of claim 11, wherein disposing the programmable volumes within phase change material elements comprises disposing a laterally constricted portion of the programmable volumes between the first end and the second end, wherein the laterally constricted portions of adjacent memory cells are in alternating contact with the first end and the second end.

13. A method of forming a memory device, comprising:

forming a plurality of memory cells, each memory cell of the plurality of memory cells having a first electrode, a second electrode, and a programmable volume disposed therebetween, wherein widths of the first electrodes of adjacent memory cells are different from one another and widths of the second electrodes of adjacent memory cells are different from one another; and forming the first electrodes and the second electrodes.

\* \* \* \* \*